(12) United States Patent
Rangarajan et al.

(10) Patent No.: US 6,573,480 B1
(45) Date of Patent: Jun. 3, 2003

(54) USE OF THERMAL FLOW TO REMOVE SIDE LOBES

(75) Inventors: Bharath Rangarajan, Santa Clara, CA (US); Ramkumar Subramanian, San Jose, CA (US); Michael K. Templeton, Atherton, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 74 days.

(21) Appl. No.: 09/800,166

(22) Filed: Mar. 6, 2001

Related U.S. Application Data

(60) Provisional application No. 60/242,479, filed on Oct. 24, 2000.

(51) Int. Cl.[7] .................................................. F27B 5/14
(52) U.S. Cl. ..................... 219/411; 219/413; 219/390; 438/795; 430/322
(58) Field of Search ................................. 219/411, 413, 219/390, 405; 392/416, 418; 438/795; 118/724–725, 728, 730, 50.1; 430/5, 322, 325, 330, 328, 311, 315

(56) References Cited

U.S. PATENT DOCUMENTS

| | | | | |
|---|---|---|---|---|
| 6,191,397 B1 | * | 2/2001 | Hayaski et al. | 219/497 |
| 6,445,439 B1 | * | 9/2002 | McCullough | 355/30 |
| 6,465,160 B1 | * | 10/2002 | Wang et al. | 430/322 |

* cited by examiner

*Primary Examiner*—Teresa Walberg
*Assistant Examiner*—Shawntina T. Fuqua
(74) *Attorney, Agent, or Firm*—Amin & Turocy, LLP

(57) ABSTRACT

In invention provides a system for reducing or eliminating side lobes in patterned resist coatings. The system heats the resist briefly to induce the resist to flow. The system allows the resist to flow long enough for the side lobes to level, but not so long as to corrupt the resist pattern. The original resist pattern may be biased to allow for some flow during the side lobe reduction process. The invention is useful in eliminating side lobes that typically result when an attenuated phase shift mask is used to form a patterned resist coating with fine, sharp-edged features.

7 Claims, 7 Drawing Sheets

USE OF THERMAL FLOW TO REMOVE SIDE LOBES

CROSSREFERENCE TO RELATED APPLICATIONS

This application claims the benefit of U.S. Provisional Patent Application Ser. No. 60/242,479, filed Oct. 24, 2000, entitled USE OF THERMAL FLOW TO REMOVE SIDE LOBES.

TECHNICAL FIELD

The present invention relates to semiconductor processing in general and in particular to a system and process for reducing side lobes in resist coatings patterned with attenuated phase shift masks.

BACKGROUND OF THE INVENTION

In the semiconductor industry, there is a continuing trend toward higher device densities. To achieve these high densities there have been, and continue to be, efforts toward scaling down device dimensions on semiconductor wafers. In order to accomplish higher device density, smaller and smaller features sizes are required. These may include the width and spacing of interconnecting lines, spacing and diameter of contact holes, and surface geometry of corners and edges of various features.

High resolution lithographic processes are used to achieve small features with close spacing between adjacent features. In general, lithography refers to processes for pattern transfer between various media. Lithography is a technique used for integrated circuit fabrication in which a silicon slice, the wafer, is coated uniformly with a radiation-sensitive film, the resist. The film is selectively exposed with radiation (such as optical light, x-rays, or an electron beam) through an intervening master template, the mask, forming a particular pattern. Areas of the coating exposed through the mask become either more or less soluble (depending on the type of coating) in a particular solvent developer. The more soluble areas are removed in a developing process leaving the less soluble areas in the form of a patterned coating.

When the mask pattern is sufficiently fine, diffraction of radiation at the edges of the pattern affects the lithographic process. As illustrated in FIG. 7 the intensity profile 700 of radiation passing through a narrow slit in an ordinary mask has a Gaussian distribution when the radiation reaches the substrate surface. As a result, edges of features are tapering rather than sharp and the resist image differs from that of the mask.

Attenuated phase shift masks (PSMs) are designed to compensate for diffraction and generate patterned resists with sharp edged features. Whereas the opaque regions of an ordinary mask are wholly opaque, the opaque regions of a PSM are partially transparent. The radiation that passes through the partially opaque regions, typically about 4 to about 15 percent of the incident radiation, is shifted in phase so that it is 180 degrees out of phase with the radiation passing through the transparent regions. The phase shifted radiation destructively interferes with diffracted radiation around the edges of transparent regions, giving the intensity profile 710 shown at the bottom of FIG. 7. Intensity profile 710 goes to zero near feature edges. However, the radiation intensity rises again away from the feature edges. As illustrated in FIG. 8, the intensity profile produced by a PSM mask 810 results in lobes near the edges of features and dimpling of the patterned resist 820 away from the feature edges. Side lobes and dimpling can lead to defects in the finished product. There is an unsatisfied need for a process of removing side lobes and dimpling from patterned resist coatings.

SUMMARY OF THE INVENTION

In invention provides a system for reducing or eliminating side lobes in patterned resist coatings. The system heats the resist briefly to induce the resist to flow. The system allows the resist to flow long enough for the side lobes to level, but not so long as to corrupt the resist pattern. The original resist pattern may be biased to allow for some flow during the side lobe reduction process. The invention is useful in eliminating side lobes that typically result when an attenuated phase shift mask is used to form a patterned resist coating with fine, sharp-edged features.

In one aspect, the invention provides a system for reducing side lobes in a patterned resist coating including a heating system that heats the resist in a controlled manner causing the resist to flow sufficiently to significantly reduce side lobes while substantially preserving the resist pattern.

In another aspect, the invention provides a system for reducing side lobes in a patterned resist coating on a substrate, including means for heating the resist in a controlled manner to cause the resist to flow sufficiently to substantially reduce side lobes while substantially preserving the resist pattern.

In another aspect, the invention provides a method of reducing side lobes in a patterned resist coating, including the step of applying sufficient heat to the resist to cause the resist to flow and thereby substantially reduce side lobes in the resist coating.

In a further aspect, the invention provides a method of preparing a patterned resist coating including the steps of forming a resist coating on a substrate, forming a first pattern in the resist using an attenuated phase shift mask, wherein the first pattern has side lobes, and applying heat to the resist and thereby causing it to flow until the side lobes are reduced.

The invention extends to features hereinafter fully described and features particularly pointed out in the claims. The following detailed description and the annexed drawings set forth in detail certain illustrative examples of the invention. These examples are indicative of but a few of the various ways in which the principles of the invention may be employed. Other ways in which the principles of the invention may be employed and other objects, advantages and novel features of the invention will be apparent from the detailed description of the invention when consider in conjunction with the drawings.

DETAILED DESCRIPTION OF THE INVENTION

Figure 1A:
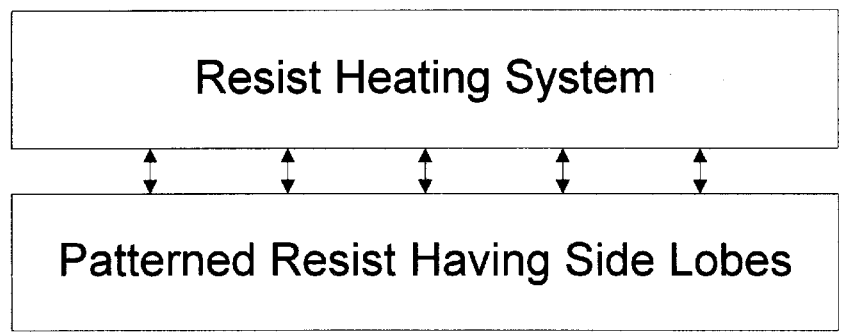
FIG. 1a is a high level schematic illustration of a system according to one aspect of the invention.
Figure 1B:
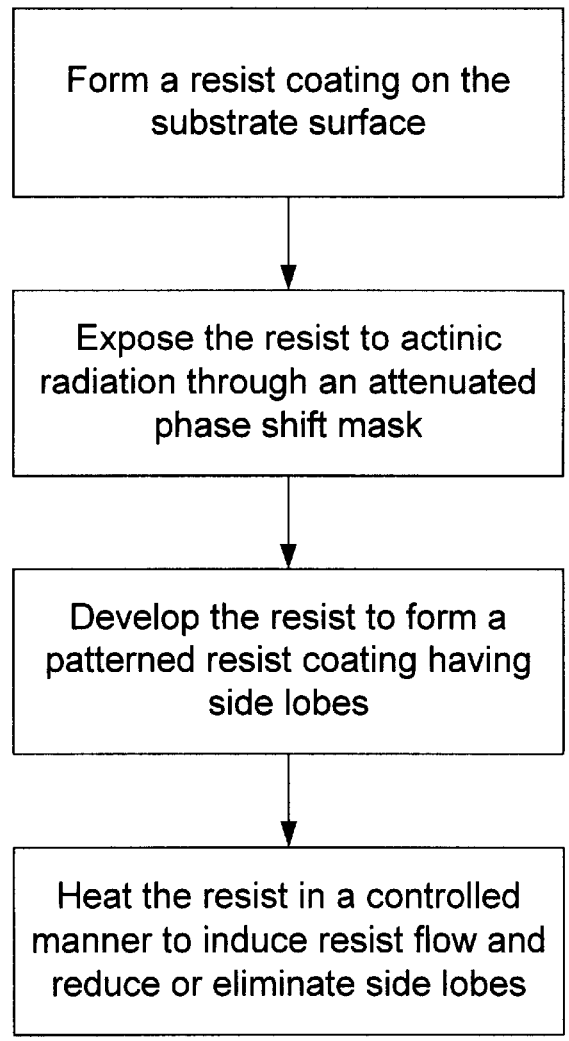
FIG. 1b is a flow diagram of a process according to one aspect of the invention.

In one aspect, the invention provides a system, as illustrated in FIG. 1*a*, that heats a patterned resist to reduce or eliminate side lobes. The system heats the resist in a controlled manner causing a limited resist flow that reduces or eliminates side lobes. In another aspect, the invention provides a method of removing side lobes that includes controlled heating of the resist, as illustrated in FIG. 1*b*.

The resist may be of virtually any type. It may be organic or inorganic, positive or negative tone, polymeric or non-polymeric. The resist may be a photoresist responsive to visible light, ultraviolet light, or x-rays, or the resist may be an electron beam resist or an ion beam resist. The resist may be chemically amplified. Resists are commercially available from a number of sources, including Shipley Company, Kodak, Hoechst Celanese Corporation, Clariant, JSR Microelectronics, Hunt, Arch Chemical, Aquamer, and Brewer. Specific examples of resist coatings include novalacs, poly-t-butoxycarbonyloxystyrenes (PBOCOS), poly-methylmethacrylates (PMMA), poly(olephin sulfones) (POS), and poly(methyl isophenyl ketones) (PMIPK).

The resist is coated on a substrate, which is typically a semi-conducting material, such as silicon. In addition to a semiconducting material, the substrate may include various elements and/or layers; including metal layers, barrier layers, dielectric layers, device structures, active elements and passive elements including silicon gates, word lines, source regions, drain regions, bit lines, bases emitters, collectors, conductive lines, conductive plugs, etc. Usually, these materials will have melting points and glass transition temperatures above the temperature at which the resist flows.

The resist coating may be formed on the substrate surface by any suitable means. Spin coating, dip coating, or vapor deposition may be used, depending on the coating material. For example, a 157 nm sensitive photoresist, a 193 nm sensitive photoresist, an I-line, H-line, G-line, E-line, mid UV, deep UV, or extreme UV photoresist may be spin-coated on the substrate surface. Prior to exposure, the resist coating is often "soft-baked" to drive off solvent, improve adhesion of the resist to the substrate, and anneal stresses caused by shear forces encountered in the spinning process.

The resist is exposed through a mask to actinic radiation, which renders the exposed portion of the resist either more or less soluble, depending on the tone of the resist, in a developer solution. After treatment with the developer, the resist forms a patterned coating on the substrate. Typically, the mask is an attenuated phase shift mask that causes the resist to develop side lobes.

Side lobes are portions of the patterned resist coating located near edges of the patterned resist and having thickness greater than the thickness of the resist coating in adjacent regions of the resist coating. The side lobes are exposed during the resist development process when resist material adjacent the lobe, but distal the side of the lobe where the substrate is exposed, is removed by the developer. A side lobe is therefore typically associated with a depression or dimple in the patterned resist coating.

Side lobes are reduced when the difference in resist coating thickness between the lobe and an adjacent resist region is significantly reduced. In one aspect of the invention, the difference in thickness is reduced to less than or equal to about half the difference before the application of heat. In another aspect of the invention, the difference in thickness is reduced to a quarter of what it was. In a further aspect of the invention, the difference is substantially eliminated and thus the side lobe is substantially eliminated.

The temperature at which the resist will flow depends, of course, on the identity of the resist, but may also depend on the coating thickness and the composition of the substrate surface. Generally the resist will begin to flow at a temperature from about 100° C. to about 300° C., with commonly used resist such as novolac falling near the lower end of this range. In one aspect, the invention involves heating to resist to a temperature from about 100° C. to about 150° C. In another aspect, the invention involves heating to resist to a temperature from about 100° C. to about 120° C.

The time for which the resist is maintained at a temperature at which it flows is generally brief, sufficiently long to reduce side lobes, but not so long as to substantially alter the resist pattern. In one aspect of the invention, the resist is patterned with narrowed features to allow for some broadening during the side lobe reduction process. A slight broadening of features is not a substantial alteration of the resist pattern. The complete closing of a gap or hole that was part of the intended resist pattern would be a substantial alteration in that pattern.

The resist is usually heated for less than about 25 seconds. In one aspect of the invention, the time is less than about 5 second. In another aspect of the invention, the time is less than 0.5 seconds. In general, the higher the temperature to which the resist is raised above the temperature at which the resist begins to flow, the shorter the time that temperature will be maintained.

The resist may be heated all at once or one portion at a time. The heated resist may be allowed to cool by dissipation of the heat into unheated portions of the substrate and the surrounding, or the resist may be cooled using a heat sink such as a cooling plate or a flow of cooling gas. A cooling source may be applied simultaneously with heating to facilitate a rapid temperature drop after heating discontinues.

The resist may be heated all at once using any suitable device. Examples include one or more heat lamps, a hot plate on which the substrate is placed, a hot surface placed above the resist in proximity to the resist surface, a flow of hot gas, or an induction heater. When the entire substrate is heated at once, heating is advantageously kept uniform and sensing the temperature of the substrate to control the heating process is generally desirable.

Figure 2:
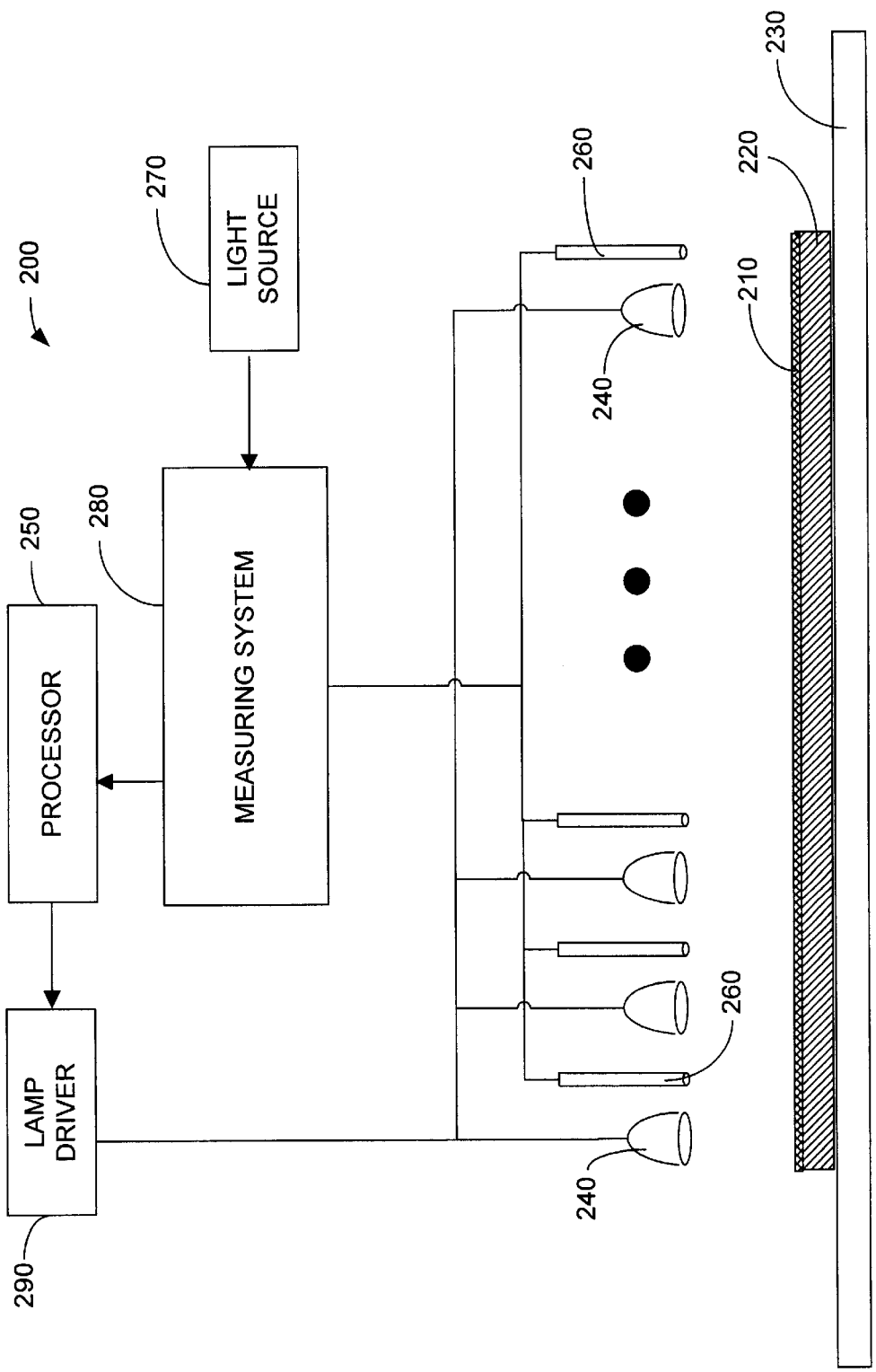
FIG. 2 is a schematic illustration of a system according to another aspect of the invention.

FIG. 2 provides an example of a system 200 for heating a resist 210 with temperature feedback. The substrate 220 is supported over plate 230. A plurality of heat lamps 240, arranged in a grid pattern over the resist, are selectively controlled by processor 250 to uniformly heat resist 210. A plurality of optical fibers 260 project light onto respective portions of the resist 210. Light from source 270 is reflected from the resist 210 and processed by a resist parameter measuring system 280 to measure at least one parameter relating to the temperature of the resist 210.

Measuring system 280 may include a spectrometer. Monochromatic light, such as laser light, from source 270 is directed to resist 210 by a plurality of optical fibers 260 via the measuring system 280. Processor 250 receives the measured data from the measuring system 280 and determines the temperature of respective portions of the resist 210. The processor 250 is operatively coupled to measuring system 280 and is programmed to control and operate the various components within the resist heating system 200 in order to carry out a side lobe reduction process. The processor 250 is also coupled to a lamp driving system 290 which drives the heat lamps 240. The lamp driving system 290 is controlled by the processor 250 so as to selectively vary heat output of the respective heat lamps 240. Each respective portion of the resist 210 has a corresponding lamp 240 and an optical fiber 260 associated therewith. The processor 250 is able to monitor the temperature of the various resist portions and selectively regulate the temperatures of each portion via the corresponding heat lamps 240. As a result, the system 200 regulates the temperature of resist 210 with substantial uniformity and thereby facilitates the process of inducing flow sufficient to reduce side lobes while substantially preserving the resist pattern.

Once sufficient heat has been applied to the resist, it may be allowed to cool by natural convection and dissipation of heat to unheated portions of the substrate and surroundings until resist flow terminates. However, applying a cooling source can facilitate control over the extent of flow. Examples of cooling sources include a cold plate on which the substrate is placed and cool gas convected over the substrate. A cold plate may be cooled by circulating cold fluid or by Peltier elements. Cool gases may be provided from a reservoir, by passing the gas through a heat exchanger, or by venting the gas from a high pressure source thereby utilizing the Joule-Thompson effect. Particularly where a cold plate is used, cooling may be carried out simultaneously with heating to facilitate rapid cooling after heating is discontinued.

A specific example is illustrated by FIG. 2 where plate 230 is a cold plate with a cold fluid circulating through it. As substrate 230 is heated from above and cooled from below, a temperature gradient develops within substrate 230, whereby resist 210 is at a temperature above the average temperature of substrate 230. When sufficient heat has been supplied to flow the resist and reduce side lobes, heating is discontinued and the resist cools rapidly due to conduction of heat to the cooler portions of substrate 230. Thereby, flow of resist 210 abruptly terminates and the extent of resist flow is accurately controlled.

Figure 3:
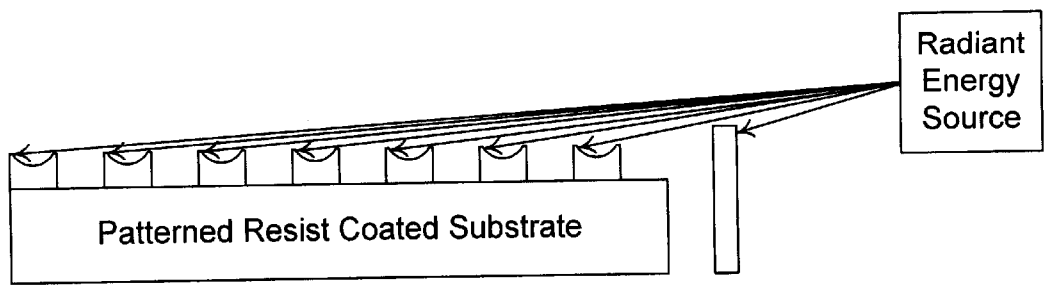
FIG. 3 is a schematic of resist heating system according to another aspect of the invention.

When the system uses a radiant energy source to heat the resist, it may be advantageous to position the radiant energy source so that the radiant energy is incident upon the resist coated substrate at a sharply oblique angle, as illustrated in FIG. 3. At a sharply oblique angle, radiant energy is incident upon the resist coating but not on the exposed substrate where the coating has been removed. This system applies the heat only where it is needed. The system is most effective if the flow of resist takes place before the heat has substantially diffused into the substrate.

Figure 4:
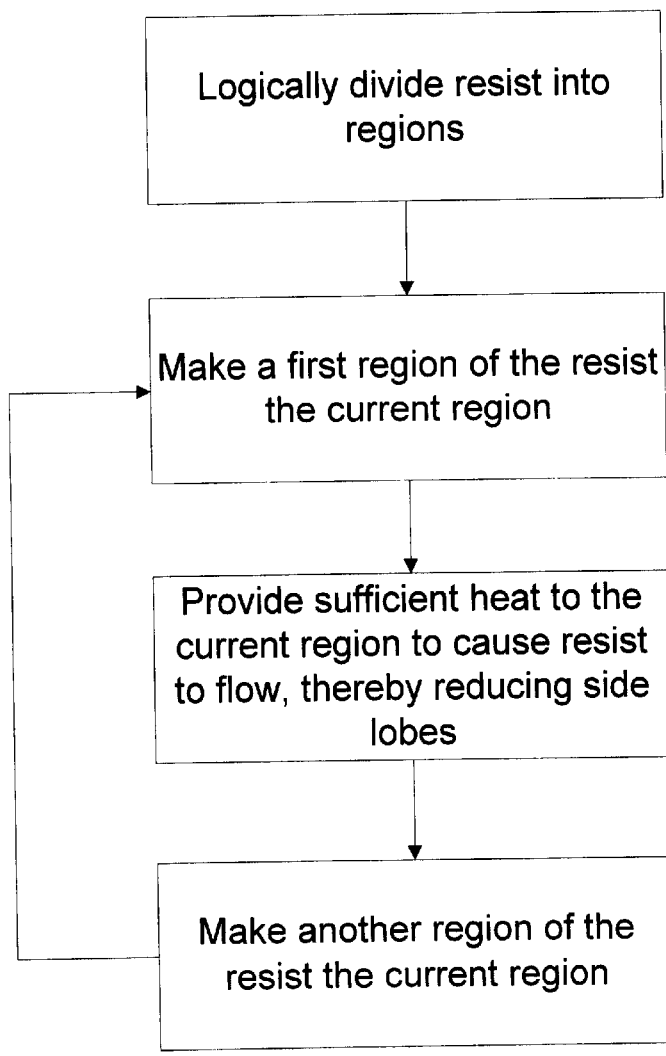
FIG. 4 is a flow diagram of a process according to another aspect of the invention.

In one aspect of the invention, the patterned resist is heated one portion at a time, as illustrated by the flow diagram of FIG. 4. For example, the resist is divided into a grid and heated one grid portion at a time or is divided into a series of bands and heated one band at a time. The source of heat may scan across the resist, or it may jump from one region to another. An advantage of heating the resist one portion at a time is that unheated portions of the resist and substrate can act as a heat sink to facilitate rapid termination of resist flows.

A system similar to that shown in FIG. 2 may be used to scan across the substrate heating one band of the resist at a time. In this example, the heating lamps and temperature sensors are placed in a row and the substrate is carried past the lamps and sensors in a direction perpendicular to the row. The processor may be coupled to the system for moving the substrate so that the rate of movement may be controlled in addition to the intensity of light from the lamps. A cooling plate may be placed beneath the substrate and conveyed along with the substrate past the heating lamps.

Figure 5:
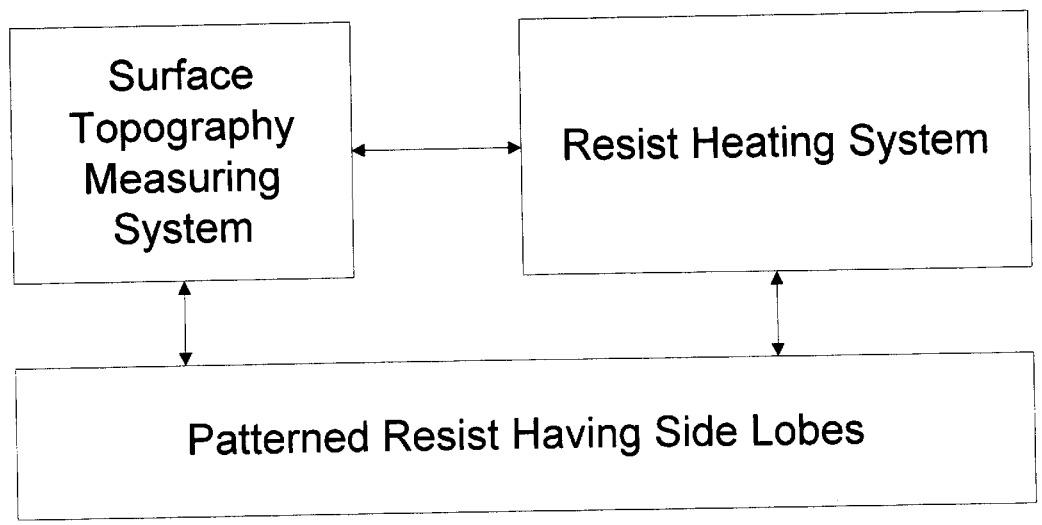
FIG. 5 is a high level schematic illustration of a system according to another aspect of the invention

In another aspect of the invention, the system includes a sub-system for monitoring surface topography as illustrated by FIG. 5. The topography monitoring system includes, for example, an interferometer or an electron microscope. The sub-system may be used to provide feed-back control over the extent of heating and resist flow. The topography may be monitored at a plurality of locations using a system such as show in FIG. 2 using interferometers in place of spectro-photometers 260.

Figure 6:
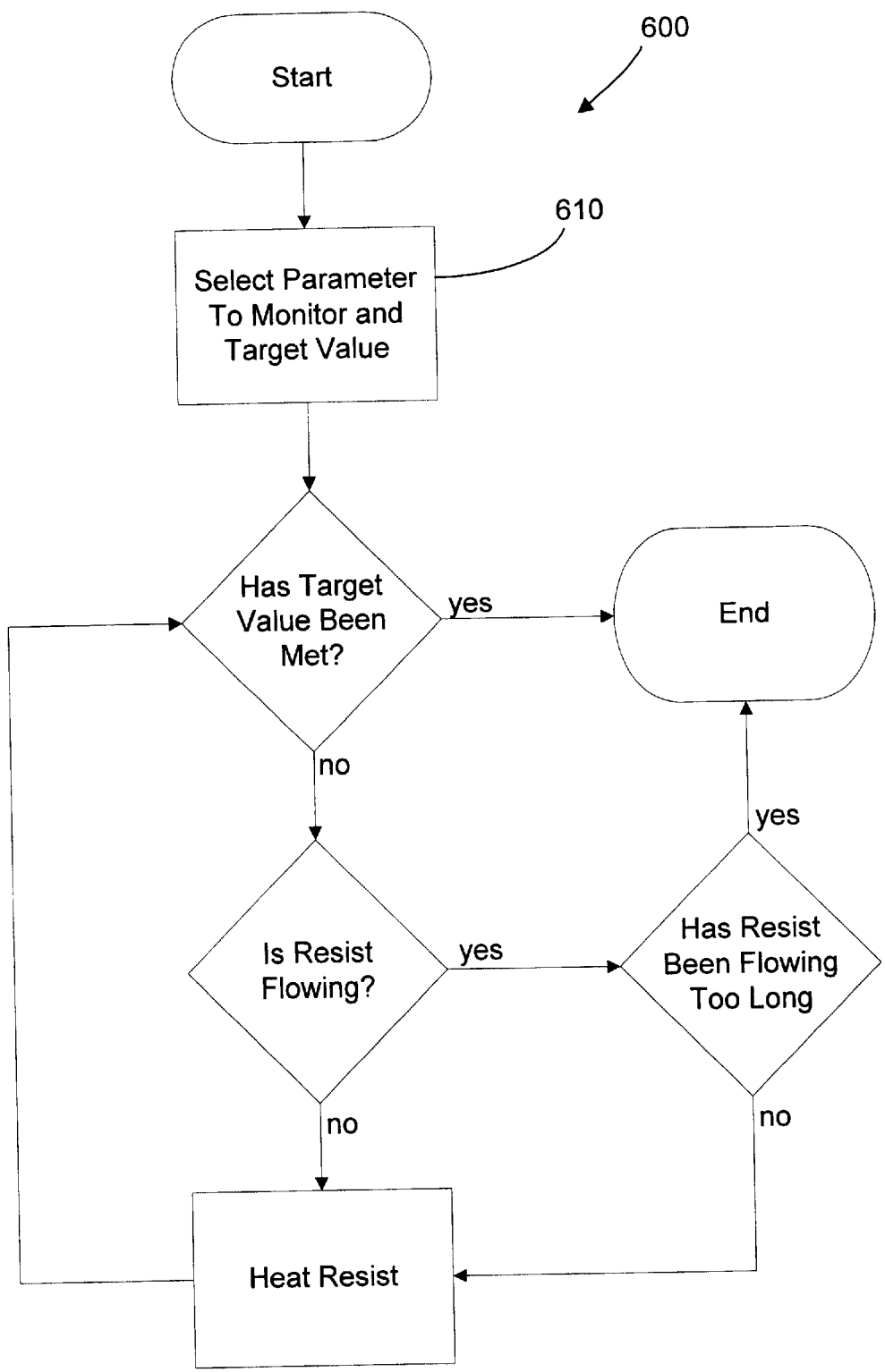
FIG. 6 is a schematic diagram of a process according to another aspect of the invention.
Figure 7:
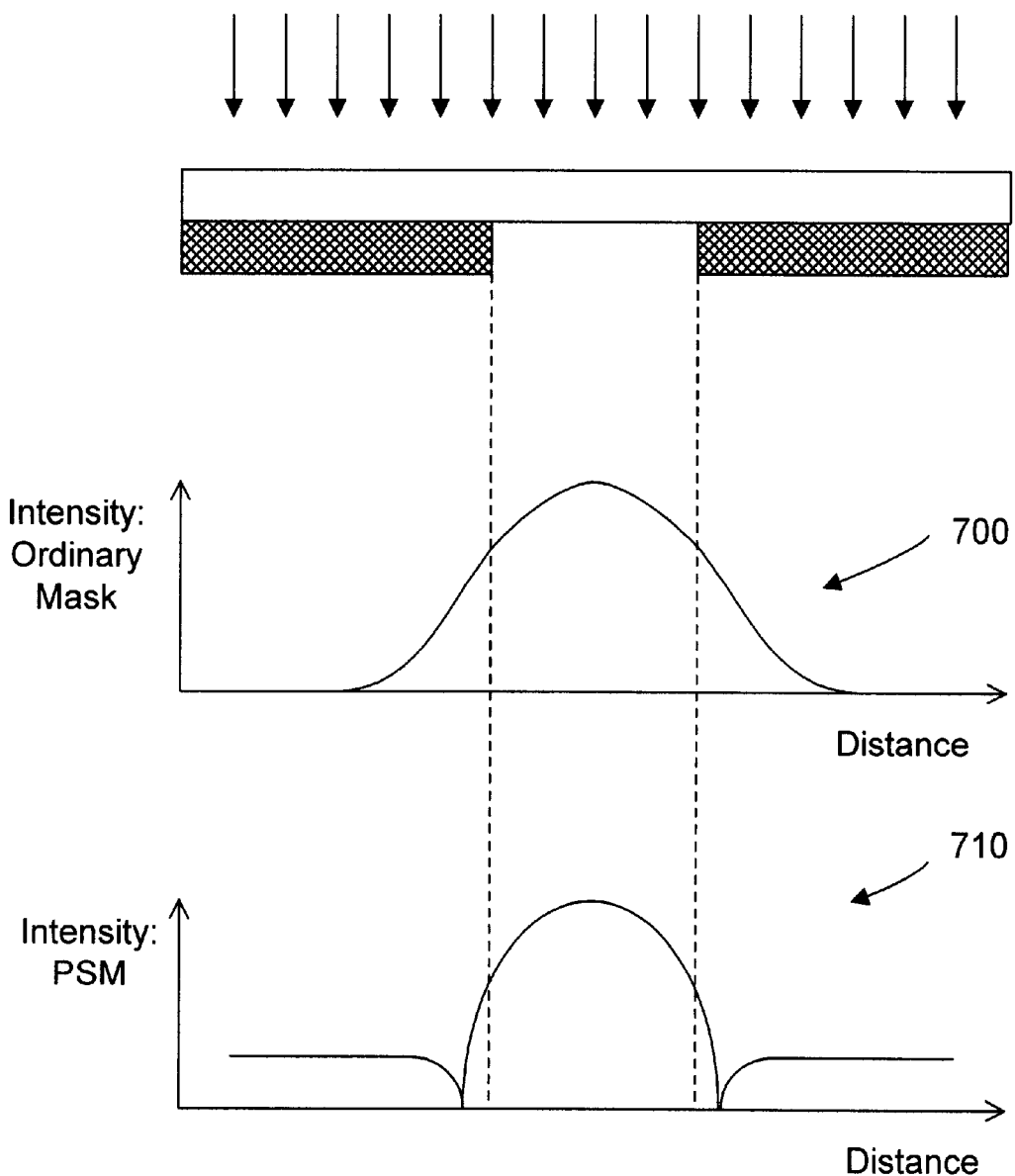
FIG. 7 is a schematic of a mask and intensity profiles resulting from the mask depending on whether its opaque regions are transparent or partially transparent.
Figure 8:
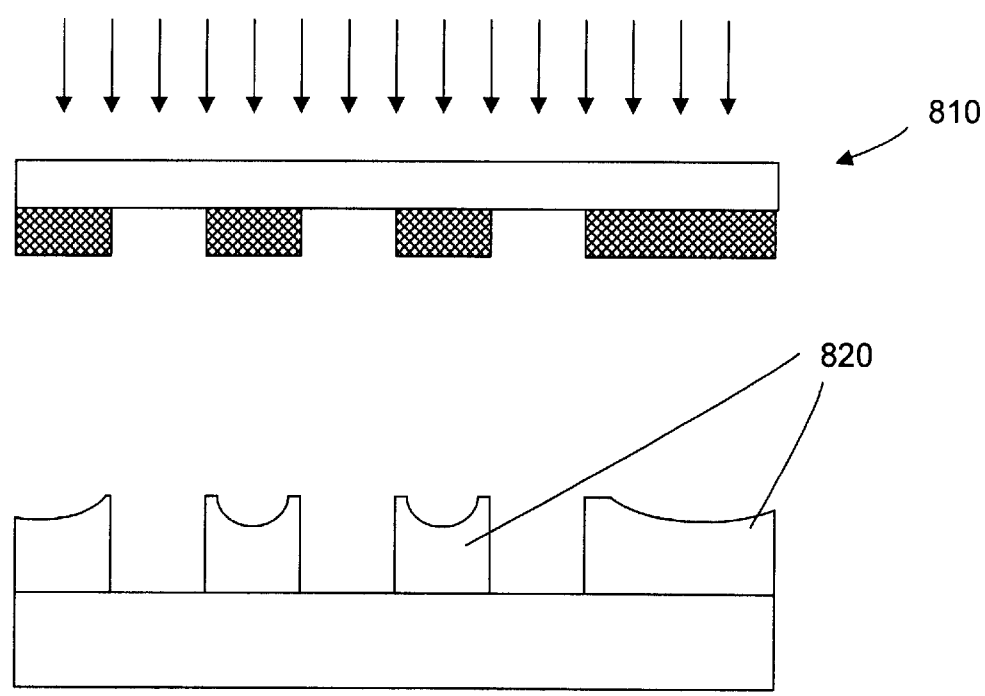
FIG. 8 is a schematic of an attenuated phase shift mask and the profile of a resist coating patterned with the mask.

FIG. 6 provides a flow diagram for an exemplary process 600 using a topography monitoring system. In step 610, a parameter indicative of surface topography is selected, such as the height of a side lobe or the depth of a dimple. The the resist is heated until it begins to flow. Heating continues until either the target value is met for the parameter being monitored, e.g., the side lobe is substantially reduced, or the resist has been flowing for a period exceeding a maximum duration.

What has been described above is the present invention and several of its specific aspects. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for reducing side lobes in a patterned resist coating, comprising:

a heating system that heats the resist in a controlled manner causing the resist to flow sufficiently to significantly reduce side lobes while substantially preserving the resist pattern.

2. The system of claim 1 further comprising a system for measuring resist topography and a controller, the controller controlling the heating system in response to measurements from the resist topography measuring system.

3. The system of claim 2, wherein the system for measuring resist topography measures the resist coating thickness, or a parameter that varies in proportion thereto, at a point on the substrate surface.

4. The system of claim 1, further comprising a cooling device.

5. The system of claim 4, wherein in the heating and cooling devices are applied simultaneously.

6. The system of claim 5, wherein the heating and cooling devices create a temperature gradient through the substrate.

7. A system for reducing side lobes in a patterned resist coating on a substrate, comprising:

means for heating the resist in a controlled manner to cause the resist to flow sufficiently to substantially reduce side lobes while substantially preserving the resist pattern.

* * * * *